United States Patent
Kobayashi et al.

(10) Patent No.: US 8,252,166 B2
(45) Date of Patent: Aug. 28, 2012

(54) METHOD OF ROUGHENING ROLLED COPPER OR COPPER ALLOY FOIL

(75) Inventors: Yousuke Kobayashi, Ibaraki (JP); Atsushi Miki, Ibaraki (JP); Keisuke Yamanishi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/243,187

(22) Filed: Sep. 23, 2011

(65) Prior Publication Data

US 2012/0012463 A1 Jan. 19, 2012

Related U.S. Application Data

(62) Division of application No. 12/303,899, filed as application No. PCT/JP2007/061720 on Jun. 11, 2007.

(30) Foreign Application Priority Data

Jun. 12, 2006 (JP) .................. 2006-162513

(51) Int. Cl.
*C25D 3/38* (2006.01)
*C25D 5/00* (2006.01)

(52) U.S. Cl. ...................... 205/111; 205/112

(58) Field of Classification Search .............. None
See application file for complete search history.

(56) References Cited

U.S. PATENT DOCUMENTS

| | | | | |
|---|---|---|---|---|
| 3,220,897 A * | 11/1965 | Conley et al. | ................ | 428/606 |
| 3,894,843 A * | 7/1975 | Jarvis | ............... | 436/98 |
| 3,998,601 A * | 12/1976 | Yates et al. | .................. | 428/607 |
| 4,524,089 A * | 6/1985 | Haque et al. | .................. | 427/488 |
| 4,935,310 A | 6/1990 | Nakatsugawa | | |
| 6,093,499 A | 7/2000 | Tomioka | | |
| 6,497,806 B1 | 12/2002 | Endo | | |
| 6,676,823 B1 * | 1/2004 | Bokisa | .......................... | 205/296 |
| 6,835,442 B2 | 12/2004 | Kudo et al. | | |
| 6,893,742 B2 | 5/2005 | Chen et al. | | |
| 2005/0175826 A1 | 8/2005 | Suzuki | | |
| 2006/0088723 A1 | 4/2006 | Suzuki | | |
| 2009/0162685 A1 | 6/2009 | Kobayashi et al. | | |
| 2010/0040873 A1 | 2/2010 | Kohiki et al. | | |
| 2010/0212941 A1 | 8/2010 | Higuchi | | |
| 2010/0261033 A1 | 10/2010 | Moriyama et al. | | |

FOREIGN PATENT DOCUMENTS

| | | |
|---|---|---|
| JP | 06-017258 A | 1/1994 |
| JP | 2000-273684 A | 10/2000 |
| JP | 2002-241989 A | 8/2002 |
| JP | 2005-290521 A | 10/2005 |
| JP | 2005-340635 A | 12/2005 |

* cited by examiner

*Primary Examiner* — Harry D Wilkins, III (74) *Attorney, Agent, or Firm* — Howson & Howson LLP (57) ABSTRACT

A rolled copper or copper alloy foil having a roughened surface formed of fine copper particles is obtained by subjecting a rolled foil to roughening plating with a plating bath containing copper sulfate (Cu equivalent of 1 to 50 g/L), 1 to 150 g/L of sulfuric acid, and one or more additives selected among sodium octyl sulfate, sodium decyl sulfate, and sodium dodecyl sulfate under the conditions of temperature of 20 to 50° C. and current density of 10 to 100 A/dm$^2$. The foil has reduced craters, which are defects unique to rolled foils having a roughened surface, has high strength, adhesive strength with the resin layer, acid resistance and anti-tin plating solution properties, high peel strength, favorable etching properties and gloss level, and is suitable for producing a flexible printed wiring board capable of bearing a fine wiring pattern. A method of roughening the rolled foil is also provided.

24 Claims, 4 Drawing Sheets

METHOD OF ROUGHENING ROLLED COPPER OR COPPER ALLOY FOIL

CROSS REFERENCE TO RELATED APPLICATIONS

This application is a divisional of co-pending U.S. application Ser. No. 12/303,899 which is the National Stage of International Application No. PCT/JP2007/061720, filed Jun. 11, 2007, which claims the benefit under 35 USC 119 of Japanese Application No. 2006-162513, filed Jun. 12, 2006.

BACKGROUND OF THE INVENTION

The present invention generally relates to a rolled copper or copper alloy foil comprising a roughened surface, and in particular relates to a rolled copper or copper alloy foil which has reduced craters, high strength, adhesive strength with the resin layer, acid resistance and anti-tin plating solution properties, high peel strength, favorable etching properties and gloss level, and is also suitable for use in producing a flexible printed wiring board capable of bearing a fine wiring pattern, as well as to a method of roughening the rolled copper or copper alloy foil. The term "craters" as used herein refers to the minute spot-shaped surface irregularities caused by uneven roughening treatment. In addition, the expressions of % and ppm used herein refer to wt % and wtppm, respectively.

Since a high purity copper foil is soft in comparison to copper alloy, there is an advantage in that rolling can be performed easily and it is possible to produce an ultra thin rolled copper foil. From this perspective, high purity copper foil is preferable for use in a flexible printed wiring board required to bear a fine pattern. Meanwhile, a copper alloy rolled copper foil is characterized in that, by adding trace amounts of alloy elements, it is possible to increase corrosion resistance and in particular increase the strength of the copper foil, whereby the body of the copper foil becomes strong and resilient to scratches and breaks. Thus, since it is possible to similarly make the copper foil thin and easily bear a fine pattern, is useful for use in a flexible printed wiring board.

The present invention relates to a rolled copper or copper alloy foil and its roughening method that is suitable for producing a flexible printed wiring board capable of controlling the generation of craters.

In recent years, with the development of miniaturization/integration technology of components to be mounted on semiconductor devices and various electronic chips and the like, a finer pattern is being demanded of print wiring boards to be produced from the flexible printed wiring boards mounted with the foregoing components.

Conventionally used was an electrolytic copper foil subject to roughening treatment in order to improve the adhesive properties with resin, but there were problems in that the roughening treatment caused the significant deterioration in the etching properties of the copper foil, made etching difficult at a high aspect ratio, caused undercuts during the etching process, and made the bearing of a sufficiently fine pattern impossible.

Thus, in order to inhibit the occurrence of undercuts during the etching process and to meet the demands of a fine pattern, a method of moderating the roughening treatment of the electrolytic copper foil, that is, a method of achieving a low profile (reduction in roughness) has been proposed.

Nevertheless, achieving a low profile of the electrolytic copper foil will cause a problem of deteriorating the adhesive strength between the electrolytic copper foil and the insulating polyimide layer. Thus, there are demands of achieving a high-level fine wiring pattern on the one hand, however, there is a problem in that it is not possible to maintain the desired adhesive strength on the other hand, and the wiring will separate from the polyimide layer at the processing stage.

As a solution of the foregoing problem, proposed is a method of using an electrolytic copper foil in which the surface has not been subject to roughening treatment, forming a thin zinc-series metallic layer thereon, and further forming polyamide resin thereon (for instance, refer to Japanese Patent Laid-Open Publication No. 2002-217507).

Additionally proposed is technology for forming a phosphorous-containing nickel plating layer on the electrolytic copper foil for the purpose of preventing undercuts (for instance, refer to Japanese Patent Laid-Open Publication No. S56-155592). However, the surface of the electrolytic copper foil in this case needs to be a rough surface, and the technology at least tolerates such rough surface. In addition, all Examples of Japanese Patent Laid-Open Publication No. S56-155592 form a phosphorous-containing nickel plating layer on the rough surface of the electrolytic copper foil.

Nevertheless, the characteristics required for achieving a sophisticated fine pattern of a copper foil are not limited to the undercuts caused by the etching and the adhesive properties with the resin. Examples of other required characteristics are superior strength, acid resistance, anti-tin plating solution properties, and gloss level.

Nevertheless, it is unlikely that these comprehensive problems have been studied in the past. At present a copper foil suitable for overcoming the foregoing problems has not yet been discovered.

In light of the foregoing circumstances, rolled copper foils formed of high-strength pure copper are being used in order to overcome the problems of the electrolytic copper foil described above.

Generally speaking, a copper foil obtained by additionally performing fine copper plating (so-called "red treatment") to a rolled copper foil formed of pure copper to increase the adhesive strength with resin and the like is well known.

Copper and cobalt alloy or ternary alloy of copper, cobalt and nickel is usually further plated on this roughened surface for forming a copper foil to be used in a print circuit (refer to Japanese Published Examined Patent Application (Kokoku) No. H6-50794 and Japanese Published Examined Patent Application (Kokoku) No. H6-50795).

In recent years, rolled copper or copper alloy foil with improved strength and corrosion resistance capable of bearing a fine wiring pattern is being proposed in substitute for conventional rolled copper foil. See Japanese Patent Laid-Open Publication No. 2002-241989.

However, when copper is plated to this kind of copper alloy rolled copper foil and minute copper particles are formed, defects referred to as craters will arise. These craters are minute spot-shaped surface irregularities caused by uneven roughening treatment that become holes (spots) during the treatment, in other words, craters are defects in which copper particles are not formed or are formed sparsely. These craters have an area of roughly 10 to 50 $\mu m^2$ and an average diameter of roughly 3 to 10 $\mu m$. The term "craters" as referred to herein is used in this context.

The generation of these craters affects all characteristics including the adhesive strength with the resin layer, acid resistance or anti-tin plating solution properties, peel strength, etching unevenness, and gloss level, and becomes an obstacle in achieving a fine wiring pattern. In particular, etching unevenness is undesirable because the abnormal appearance will become a problem.

SUMMARY OF THE INVENTION

The present invention was devised in view of the foregoing problems. Thus, an object of the present invention is to provide a roughened rolled copper or copper alloy foil which has reduced craters, which are obvious defects unique to rolled copper or copper alloy foils with a roughened surface, has high strength, adhesive strength with the resin layer, acid resistance and anti-tin plating solution properties, high peel strength, favorable etching properties and gloss level, and suits for use in producing a flexible printed wiring board capable of bearing a fine wiring pattern, as well as to provide a method of roughening the rolled copper or copper alloy foil.

In order to achieve the foregoing object, the present invention provides the invention described below. A rolled copper or copper alloy foil comprises a roughened surface formed of fine copper particles obtained by subjecting a rolled copper or copper alloy foil to roughening plating with a plating bath containing copper sulfate (Cu equivalent of 1 to 50 g/L), 1 to 150 g/L of sulfuric acid, and one or more additives selected among sodium octyl sulfate, sodium decyl sulfate, and sodium dodecyl sulfate under the conditions of a temperature of 20 to 50° C., and a current density of 10 to 100 A/dm$^2$. The copper sulfate, sulfuric acid, temperature, and current density all show the preferable conditions to be used upon carrying out the plating process.

One or more of the additives selected among sodium octyl sulfate, sodium decyl sulfate, and sodium dodecyl sulfate may be added in a total amount of 5 to 100 wtppm. If the lower limit of addition is less than 5 ppm, the effect of adding the additive will be low. Meanwhile, if the upper limit of addition exceeds 100 ppm, this is impractical in light of the foaming properties and effluent treatment. The additive range is preferably 10 to 50 ppm. However, since the crater reduction effect is recognized even when the foregoing upper limit is exceeded, the use of a rolled copper or copper alloy foil subject to such excessive additives is not particularly denied as long as it can be used by solving problems according to the conditions of exceeding the foregoing upper limit. Thus, the foregoing numerical range merely shows the preferable conditions.

Roughening plating is performed with a plating bath further containing nickel sulfate (Ni equivalent of 1 to 50 g/L) or phosphorous acid (P equivalent of 0.75 to 1000 g/L). Although the present invention is based on the roughening treatment of copper, there is no particular problem in adding other metals or non-metals to yield secondary effects. Accordingly, the present invention covers all conditions including other added elements as accessory components as well as incidental operations and effects based on such conditions.

A base plate layer formed of one or more components selected among Cu, Co, Ni or alloys having any one of the elements as its primary component is preliminarily formed on the rolled copper or copper alloy foil, and the roughened surface formed of fine copper particles is formed thereon. The formation of a base plate is a preferable mode upon performing roughening plating. However, it is not necessary to make the base plate a requisite condition. In addition, if the roughening plating of the present invention is performed appropriately, a base plate layer other than the one described above may also be used, and the present invention covers all such base plate layers.

The rolled copper alloy foil contains at least one or more elements selected among Ag, Sn, Cr, Zr, Zn, Ni, Si, Mg, and Ti in a total amount of 0.03 to 5 wt %, and the roughened surface formed of fine copper particles is formed on the rolled copper alloy foil formed of remnant Cu and unavoidable impurities. The rolled copper alloy foil may contain 0.03 to 1 wt % of Zr, 0.05 to 1 wt % of Cr and/or 0 to 1 wt % of Zn, and the roughened surface formed of fine copper particles is formed on the rolled copper alloy foil formed of remnant Cu and unavoidable impurities. The rolled copper foil described above is a typical rolled copper foil used in the present invention. It is evident that the present invention can be applied to other rolled copper alloy foils, and covers all such other rolled copper alloy foils.

A rolled copper or copper alloy foil may have a roughened surface in which the number of craters is 1.3 craters/mm$^2$ or less. A significant feature of the present invention is the capability of specifying the copper foil based on the number of craters and determining the quality thereof.

A method of roughening a rolled copper or copper alloy foil having a roughened surface formed of fine copper particles in order to inhibit the formation of craters on the roughened surface caused by non-metal inclusions of the rolled copper or copper alloy foil includes the step of subjecting a rolled copper or copper alloy foil to roughening plating with a plating bath containing copper sulfate (Cu equivalent of 1 to 50 g/L), 1 to 150 g/L of sulfuric acid, and one or more additives selected among sodium octyl sulfate, sodium decyl sulfate, and sodium dodecyl sulfate under the conditions of a temperature of 20 to 50° C., and a current density of 10 to 100 A/dm$^2$. As described above, the primary objective of the roughening method of a rolled copper or copper alloy foil is to inhibit the formation of craters, and the present invention enables the foregoing objective to be achieved. The copper foil of the present invention subject to roughening treatment significantly affects the improvement in characteristics such as the adhesive strength with the resin layer, the acid resistance or anti-tin plating solution properties, the peel strength, etching unevenness and the gloss level. Further, the present invention is quite useful in achieving a fine wiring pattern.

One or more of the additives selected among sodium octyl sulfate, sodium decyl sulfate, and sodium dodecyl sulfate can be added in a total amount of 5 to 100 wtppm. Roughening plating may be performed with a plating bath further containing nickel sulfate (Ni equivalent of 1 to 50 g/L) or phosphorous acid (P equivalent of 0.75 to 1000 g/L). A base plate layer may be formed of one or more components selected among Cu, Co, Ni or alloys having any one of the elements as its primary component is preliminarily formed on the rolled copper or copper alloy foil, and the roughened surface formed of fine copper particles is formed thereon. The copper alloy foil contains at least one or more elements selected among Ag, Sn, Cr, Zr, Zn, Ni, Si, Mg, and Ti in a total amount of 0.03 to 5 wt %, and the roughened surface formed of fine copper particles is formed on the rolled copper or copper alloy foil formed of remnant Cu and unavoidable impurities. The rolled copper alloy foil may contain 0.03 to 1 wt % of Zr, 0.05 to 1 wt % of Cr and/or 0 to 1 wt % of Zn, and the roughened surface formed of fine copper particles is formed on the rolled copper alloy foil formed of remnant Cu and unavoidable impurities.

According to the present invention, it is possible to provide a roughened rolled copper alloy foil with reduced craters, which are obvious defects unique to rolled copper or copper alloy foils having a roughened surface. In addition, this roughened rolled copper or copper alloy foil yields superior effects of having high strength, adhesive strength with the resin layer, acid resistance and anti-tin plating solution properties, high peel strength, favorable etching properties and gloss level, and is also suitable for use in producing a flexible printed wiring board capable of bearing a fine wiring pattern.

DETAILED DESCRIPTION OF THE INVENTION

Generally speaking, the roughened particle layer to be formed on the rolled copper foil is formed by performing roughening plating under the conditions of using copper sulfate (Cu equivalent of 1 to 50 g/L) and 1 to 150 g/L of sulfuric acid, temperature of 20 to 50° C., and current density of 10 to 100 A/dm$^2$. In this case, although it has been said that rolled copper foil formed of pure copper will not in particular be subject to the problem of craters, that is not necessarily the case, and craters are even observed in rolled copper foils formed of pure copper such as tough pitch copper. The reason for this is speculated to be copper oxides. This will be explained in detail later.

Figure 6:
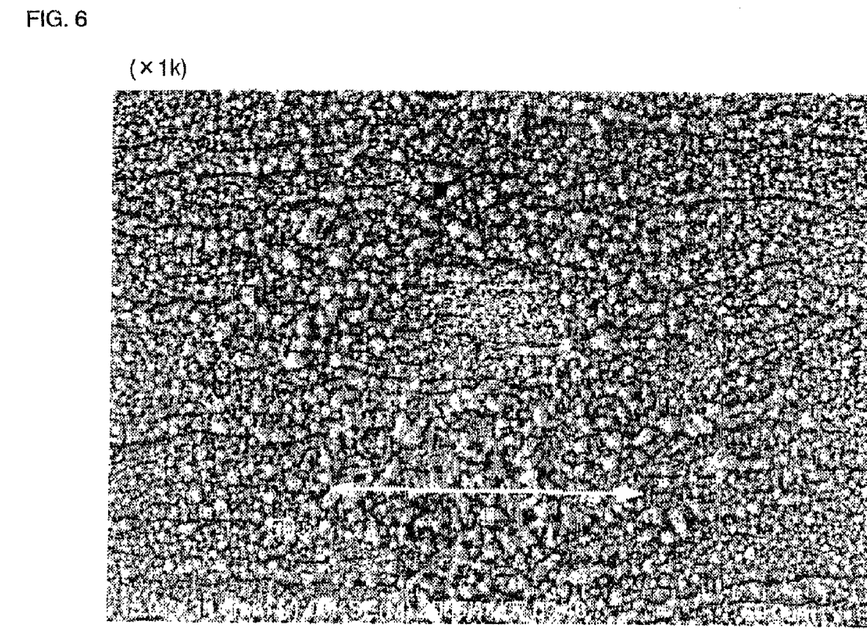
FIG. 6 shows an SEM image of the craters resulting from the performance of roughening treatment without additives of Comparative Example 1.

Meanwhile, defects of minute spot-shaped surface irregularities (referred to as "craters" in this specification) caused by uneven roughening treatment will become evident when using copper alloy foils. The roughened rolled copper or copper alloy foil craters (defects) were observed using the optical microscope as shown in FIG. 6 of Comparative Example 1 described later. The shadowy portion of the roughened surface in FIG. 6 shows craters. There were roughly 1.88 craters/mm$^2$ in the shadowy portion.

As described above, these craters are holes (spots) that occurred during the treatment. Copper particles are not formed or are scarce in the crater portion. These craters exist in a quantity of roughly 1.8 to 6 craters/mm$^2$. These craters form clear shadows or black spots on the gold plating layer to be subsequently processed and will considerably impair the appearance. By the study on the cause of these craters, the existence of non-metal inclusions was confirmed in the rolled copper foil immediately beneath the crater portion of the roughened surface. Sulfides (ZrS) existed in the case of a rolled copper foil containing Zr described later. This is considered to be because the trace amounts of S contained in the rolled copper foil selectively bonded with Zr as the added element to form sulfides.

If such non-metal inclusions exist, the non-metal inclusion portion will become electrochemically "noble" in comparison to its peripheral portion and be difficult to be plated, that is, it is speculated that copper particles are not formed or are only formed scarcely with the electrolytic conditions for performing roughening treatment.

Although this kind of phenomenon will be affected by the type of non-metal inclusion and the peripheral material to become the base material, it is considered that such phenomenon can be resolved by reducing the impurity elements of S and the like which become non-metal inclusions contained in the rolled copper foil as much as possible. Nevertheless, it is originally considered that the existence of trace amounts of inevitable impurities such as S is unavoidable, and the reduction of such unavoidable impurities has its limitations.

From this perspective, as a result that the present inventors studied the conditions of the roughening plating to be performed to the rolled copper or copper alloy foil from which conventional non-metal inclusions have been reduced as much as possible, significant improvement was seen. Specifically, the present invention provides a rolled copper or copper alloy foil comprising a roughened surface formed of fine copper particles, obtained by subjecting a rolled copper or copper alloy foil to roughening plating with a plating bath containing copper sulfate (Cu equivalent of 1 to 50 g/L), 1 to 150 g/L of sulfuric acid, and one or more additives selected among sodium octyl sulfate, sodium decyl sulfate, and sodium dodecyl sulfate under the conditions of a temperature of 20 to 50° C. and a current density of 10 to 100 A/dm$^2$.

As a result of adding one or more additives selected from the foregoing sodium octyl sulfate ($C_8H_{17}SO_4Na$), sodium decyl sulfate ($C_{10}H_{21}SO_4Na$), and sodium dodecyl sulfate ($C_{12}H_{25}SO_4Na$), it is possible to yield a significant effect of inhibiting the occurrence of craters. This constitutes the fundamental concept of the present invention.

By way of reference, there is a study report ("Surface Technology" Vol. 56, No. 1, 2005) regarding the wetting agent to the nickel plating in relation to sodium hexyl sulfate ($C_6H_{13}SO_4Na$), sodium octyl sulfate ($C_8H_{17}SO_4Na$), sodium decyl sulfate ($C_{10}H_{21}SO_4Na$), and sodium dodecyl sulfate ($C_{21}H_{25}SO_4Na$).

Nevertheless, based on this result, the inhibiting effect of hydrogen bubbles in relation to the plating pit to be formed on the nickel electrode is not uniform in the cases of adding the additives to the respective baths. In addition, it could also be said that it is near impossible to expect the same effects with the roughening plating of copper caused by the impurities of rolled copper or copper alloy.

With the foregoing electrolytic conditions, it is possible to form a uniform plating layer without being affected by non-metal inclusions. The number of generated craters must be constantly inhibited to 1.3 craters/mm$^2$ or less, preferably 1.0 craters/mm$^2$ or less, and more preferably 0.5 craters/mm$^2$ or less, and it is necessary to reduce the number of craters as much as possible.

In addition, applying the present invention enables not only to reduce the number of craters, but also to reduce the size of a single crater. As shown in the Comparative Examples described later, the crater size reaches 50 μm to 60 μm if the present invention is not applied. Contrarily, by applying the present invention, it is possible to reduce the size of a single crater to 20 μm or less, and in particular 10 μm or less. The present invention covers all of the foregoing aspects.

The roughening of the rolled copper or copper alloy foil according to the present invention can be performed based on roughening plating under the conditions of using copper sulfate (Cu equivalent of 1 to 50 g/L) and 1 to 150 g/L of sulfuric acid, temperature of 20 to 50° C., and current density of 10 to 100 A/dm$^2$. Roughening plating may also be performed by additionally adding, as needed, nickel sulfate (Ni equivalent of 1 to 50 g/L, preferably 1 to 3 g/L) or phosphorous acid (P equivalent of 0.75 to 1000 g/L, preferably 0.75 to 1 g/L) to the foregoing roughening plating bath.

Roughened particles are generally formed in the range of 0.1 to 2.0 μm. According to the present invention, it became possible to reduce the number of craters existing on the roughened surface of the rolled copper or copper alloy foil subject to roughening treatment using copper or copper alloy fine particles to 1.3 craters/mm² or less, in particular 1.0 craters/mm² or less, and even 0.5 craters/mm² or less.

As shown in the following Examples, the normal peel strength, surface roughening, and gloss level of the rolled copper or copper alloy foil subject to roughening treatment were all favorable, and it also possessed high strength which is a quality unique to rolled copper foil, and further yielded superior characteristics of possessing the acid resistance, anti-tin plating solution properties and adhesive strength with resin which are equivalent to conventional roughened rolled copper foils based on a fine copper particle layer.

There is no particular limitation as a copper alloy foil, and the present invention can be applied to any copper alloy foil that is subject to the occurrence of craters. For instance, a rolled copper alloy foil containing at least one or more types selected from Ag, Sn, Cr, Zr, Zn, Ni, Si, Mg, and Ti in a total amount of 0.03 to 5 wt % can be used.

A copper alloy rolled copper foil is characterized in that, by adding trace amounts of alloy elements, it possesses superior characteristics of increasing corrosion resistance and in particular increasing the strength of the copper foil, whereby the body of the copper foil becomes strong and resilient to scratches and breaks. Accordingly, since it is possible to similarly make the copper foil thin and easily bear a fine pattern, it is useful for use in a flexible printed wiring board.

In order to leverage these characteristics of the copper alloy rolled copper foil, it is desirable to make the amount of added elements to be a total amount of 0.03 to 5 wt %. With the alloy elements less than the lower limit (0.03 wt %) of the total amount, the effect of adding the alloy elements will be low. On the other hand, the alloy elements added in an amount exceeding the upper limit is undesirable since it will deteriorate the conductivity of the copper foil.

Furthermore, as evident from the subsequent explanation, the existence of alloy elements also promotes the generation of craters. Accordingly, the roughening plating of the present invention for inhibiting the generation of craters is useful in the copper alloy rolled copper foil. As obvious from the foregoing explanation, the additive amount of alloy elements must be decided with consideration to the increase in the number of craters.

The additive amount of alloy elements of the copper alloy rolled copper foil described in this specification shows the optimal additive amount for primarily achieving the object of inhibiting the generation of craters and increasing the strength.

Under the foregoing circumstances, particularly effective is a rolled copper alloy foil containing 0.03 to 1 wt % of Zr, 0.05 to 1 wt % of Cr and/or 0 to 1 wt % of Zn and formed of remnant Cu and unavoidable impurities, or a copper alloy foil containing 1 to 5 wt % of Ni, 0.1 to 3 wt % of Si, 0.05 to 3 wt % of Mg, and formed of remnant Cu and unavoidable impurities. The foregoing alloy foils are particularly effective in preventing the occurrence of craters.

Meanwhile, craters also occur in high purity copper foils formed of tough pitch copper. The reason why craters occur even when the copper alloy rolled copper foil has no added elements is due to reasons different from the copper alloy rolled copper foil. Upon investigating the cause, the present inventors believe that this is due to the existence of copper oxides in the material. Thus, the roughening plating of the present invention is effective even in this case.

Since high purity copper foil formed of tough pitch copper is soft in comparison to copper alloy, there is an advantage in that rolling can be performed easily and it is possible to produce an ultra thin rolled copper foil. From this perspective, high purity copper foil is preferable for use in a flexible printed wiring board required to bear a fine pattern. Nevertheless, since it is also subject to the generation of craters as with the rolled copper alloy foil described above, the inhibition of craters is strongly demanded.

As evident from the foregoing explanation, the present invention overcomes the generation of craters in high purity rolled copper foils and copper alloy foils, and provides a material that is suitable for use as a material of a flexible printed wiring board.

A coil is continuously wound around the manufactured rolled copper foil, and the copper foil obtained as described above can be further subject to electrochemical or chemical surface treatment or coating treatment of resin and the like and then used in a print wiring board or the like.

Generally, the thickness of a copper foil is required to be 18 μm or less, preferably 3 to 12 μm for use as high density wiring, however, the rolled copper or copper alloy foil subject to the roughening treatment of the present invention can be applied without any limitation to the thickness, and can be further applied similarly to both an ultra thin foil and a thick copper foil. Moreover, as other surface treatments, coating treatment using chromium metals or zinc-based metals or organic rust prevention treatment may be performed. Coupling treatment using silane or the like may also be performed. These treatment methods may be suitably used according to the usage of the copper foil of the print wiring substrate, and the present invention covers all of the foregoing aspects.

As the rolled copper or copper alloy foil, it is desirable to use the foregoing rolled copper foil in which the surface roughening Rz is 2.5 μm or less and which has not been subject to roughening treatment. Specific examples of the copper roughening plating solution and the copper roughening plating treatment solution containing Ni metal or phosphorous to be used in forming the rolled copper or copper alloy foil of the present invention are listed below. Incidentally, additives are not shown in the following plating baths.

Copper Plating Treatment:
1 to 50 g/L of Cu ion concentration
1 to 150 g/L of sulfuric acid
Electrolytic solution temperature of 20 to 50° C.
Current density of 10 to 100 A/dm²
Copper-Nickel Alloy Plating Treatment:
1 to 50 g/L of Cu ion concentration
1 to 50 g/L of Ni ion concentration
1 to 150 g/L of sulfuric acid
Electrolytic solution temperature of 20 to 50° C.
Current density of 10 to 100 A/dm²
Copper-Nickel-Phosphorous Alloy Plating Treatment:
1 to 50 g/L of Cu ion concentration
1 to 50 g/L of Ni ion concentration
0.75 to 1000 g/L of P ion concentration
1 to 150 g/L of sulfuric acid
Electrolytic solution temperature of 20 to 50° C.
Current density of 10 to 100 A/dm²

EXAMPLES

Examples of the present invention are now explained. These Examples merely illustrate a preferred example, and the present invention shall in no way be limited thereby. In other words, all modifications, other embodiments and modes covered by the technical spirit of the present invention shall be included in this invention. Incidentally, the Comparative Examples are indicated in the latter part for comparison with the present invention.

Examples 1 to 3, Comparative Examples 1 and 2

Used as the copper alloy foil was an 18 μm rolled copper foil having a surface roughness Rz of 0.7 μm formed of copper alloy containing 0.2 wt % of Cr, 0.1 wt % of Zr, 0.2 wt % of Zn, remnant Cu and unavoidable impurities. The rolled copper foil was subject to degreasing and water washing treatment, subsequently subject to pickling and water washing treatment, and electroplating of Cu as the base plate was performed under the following conditions.

Roughened Copper Electroplating Conditions

The rolled copper foil subject to base plating was subsequently subject to roughening treatment by way of copper plating treatment using plating baths added with sodium octyl sulfate (Example 1), sodium decyl sulfate (Example 2), and sodium dodecyl sulfate (Example 3).

The foregoing conditions were used as the copper roughening plating bath and roughened copper plating conditions; specifically, 10 g/L of Cu ion concentration, 50 g/L of sulfuric acid, electrolytic solution temperature of 25° C., and current density of 20 A/dm$^2$.

The additive amounts of sodium octyl sulfate, sodium decyl sulfate, and sodium dodecyl sulfate were respectively 20 wtppm. However, the additive amount of sodium dodecyl sulfate was tested in the range of 3 wtppm to 120 wtppm to confirm the effect arising from the additive amount. The plating thickness was roughly 50000 μg/dm$^2$. Various evaluation tests were performed under the following conditions regarding the rolled copper alloy foil subject to the foregoing roughening plating.

A case of no additives is shown as Comparative Example 1 and a case of adding 20 wtppm of sodium hexyl sulfate is shown as Comparative Example 2. The other electroplating bath and plating conditions were the same as the foregoing Examples.

Examination of Crater Count

The number of craters on the copper roughened surface when changing the additives of the plating bath was counted with an optical microscope to study the crater count. The results were as follows.

Example 1

Figure 1:
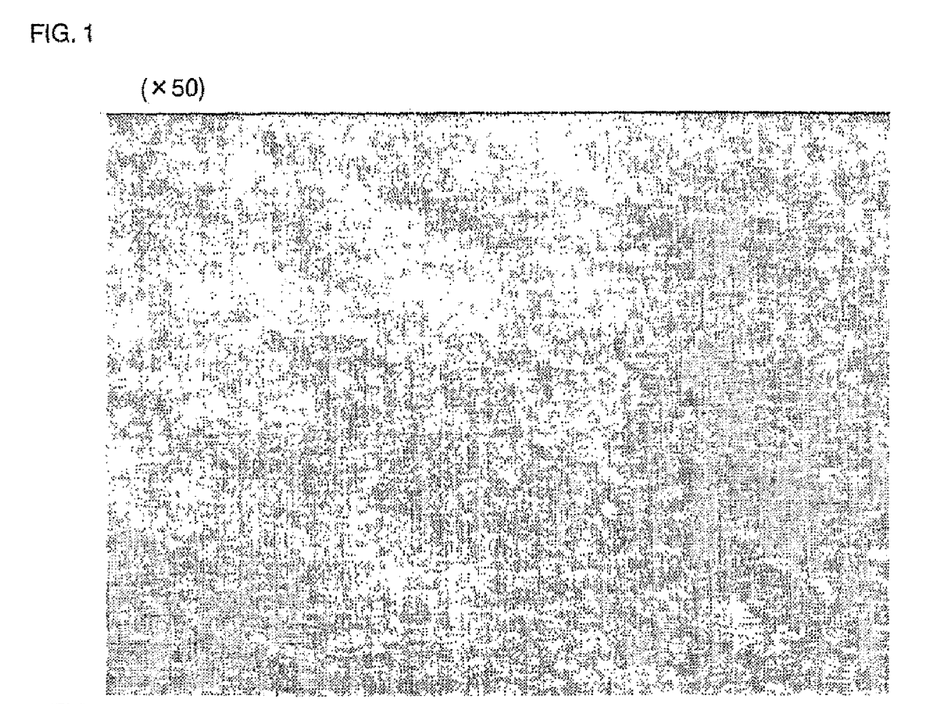
FIG. 1 is a surface micrograph in the case of performing the roughening treatment of Example 1.

When 20 wtppm of sodium octyl sulfate was added, the crater count was 0.14 craters/mm$^2$ (FIG. 1).

Example 2

Figure 2:
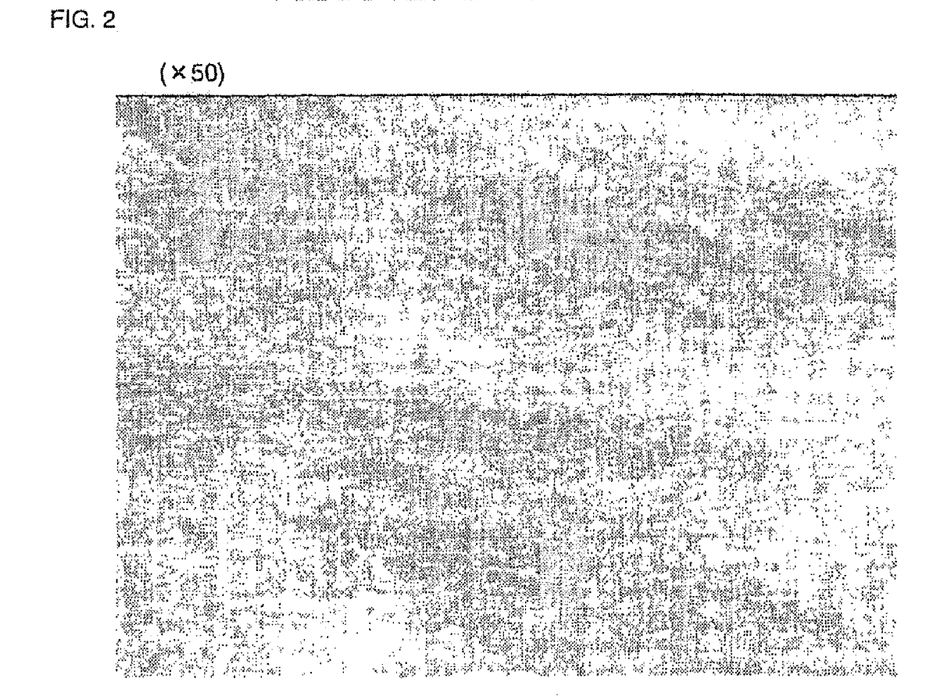
FIG. 2 is a surface micrograph in the case of performing the roughening treatment of Example 2.

When 20 wtppm of sodium decyl sulfate was added, the crater count was 0.14 craters/mm$^2$ (FIG. 2).

Example 3

Figure 3:
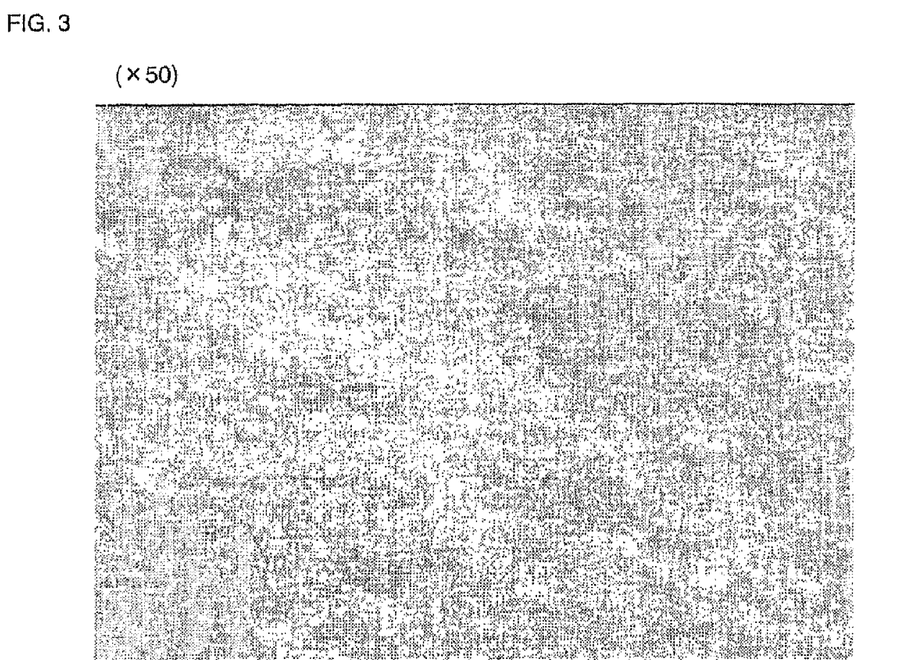
FIG. 3 is a surface micrograph in the case of performing the roughening treatment of Example 3.

When 20 wtppm of sodium dodecyl sulfate was added, the crater count was 0.14 craters/mm$^2$ (FIG. 3).

Comparative Example 1

When no additive was added, the crater count was 1.88 craters/mm$^2$ (FIG. 6).

Comparative Example 2

Figure 7:
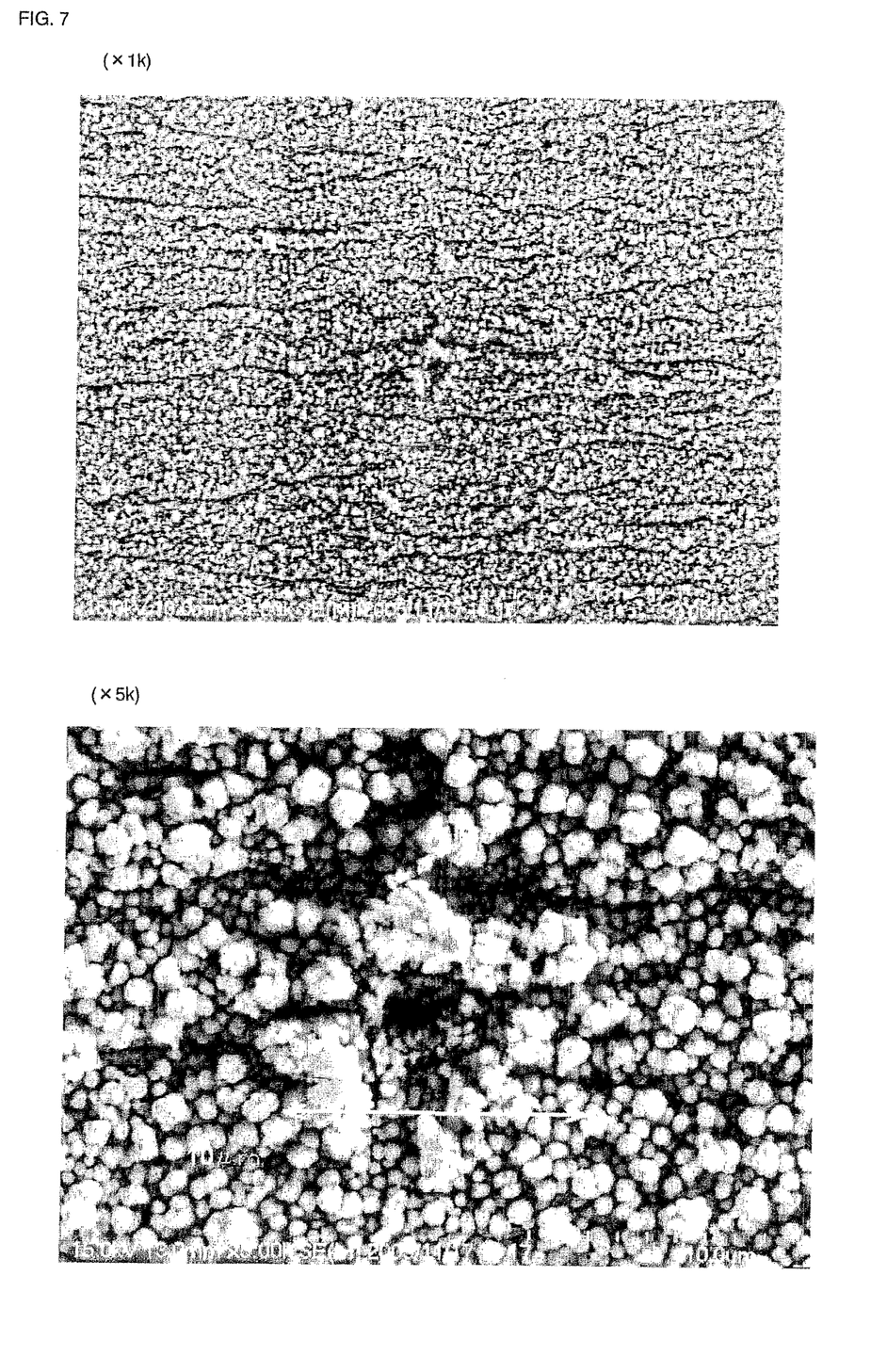
FIG. 7 shows an SEM image of the craters resulting from the performance of roughening treatment of Example 1.

When 20 wtppm of sodium hexyl sulfate was added, the crater count was 1.38 craters/mm$^2$ (FIG. 7).

Optical micrographs of the roughened surface of Examples 1 to 3 and Comparative Examples 1 and 2 are respectively shown in FIG. 1 to FIG. 5.

Figure 4:
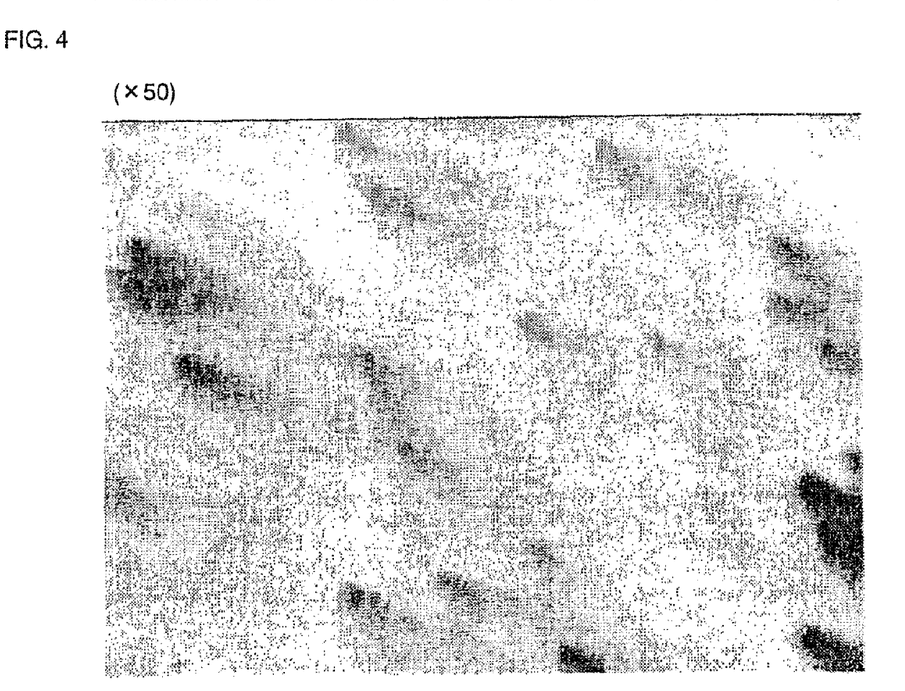
FIG. 4 is a surface micrograph in the case of performing roughening treatment without additives of Comparative Example 1.

In the case of adding no additives of Comparative Example 1, a crater count of 1.88 craters/mm$^2$ was observed. As shown in FIG. 4, the shadow portion of the roughened surface is the crater portion, of which size can be clearly observed.

Figure 5:
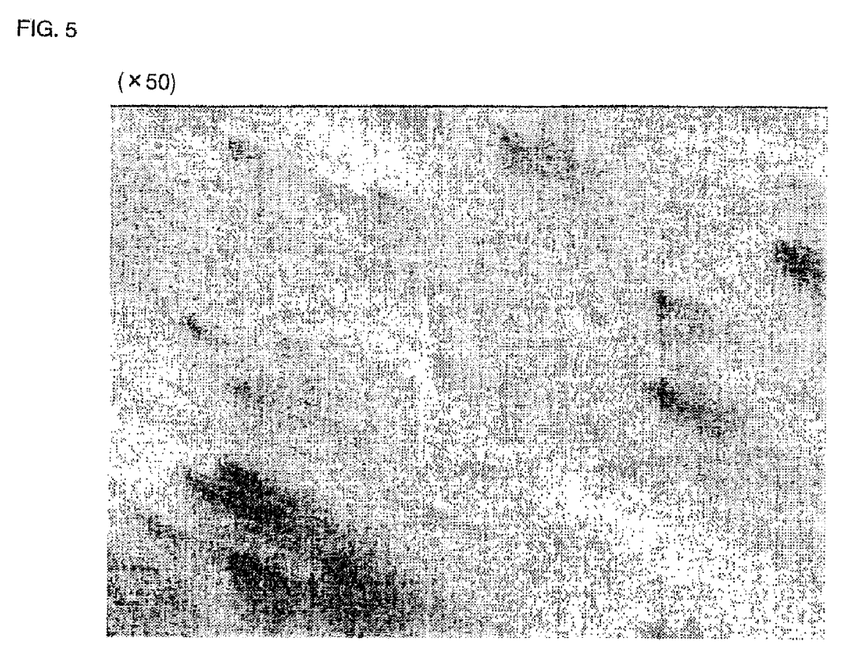
FIG. 5 is a surface micrograph in the case of performing the roughening treatment of Comparative Example 2.

Comparative Example 2 is a case where 20 wtppm of sodium hexyl sulfate was added, and a crater count of 1.38 craters/mm$^2$ was observed. The optical micrograph of the roughened surface of Comparative Example 2 is shown in FIG. 5. In this case also, the shadow portion of the roughened surface is the crater portion. The size of the crater portion can be clearly observed.

Meanwhile, in the cases of Examples 1 to 3, as respectively shown in FIG. 1 to FIG. 3, the shadow portion of the roughened surface cannot be found, and hardly any craters can be observed. As evident from the foregoing explanation, the crater inhibiting effect of the present invention is evident.

Examination of Crater Size

The SEM image of the crater portion in the case of adding no additives of Comparative Example 1 is shown in FIG. 6. As shown in FIG. 6, the crater portion is large and reaches 50 μm. Meanwhile, the case of adding 20 wtppm of sodium octyl sulfate of Example 1 is shown in FIG. 7, and, as shown in FIG. 7, the crater portion is roughly 10 μm or less and it is evident that the crater size decreased.

Examination of Crater Count when Additive Amount is Changed

Sodium dodecyl sulfate was added in amount of 3 wtppm, 5 wtppm, 10 wtppm, 15 wtppm, 20 wtppm, 40 wtppm, 80 wtppm, 100 wtppm, and 120 wtppm.

This examination yielded the following results:
with the addition of 3 wtppm, the crater count was 1.8 craters/mm$^2$;
with the addition of 5 wtppm, the crater count was 1.3 craters/mm$^2$;
with the addition of 10 wtppm, the crater count was 1.0 craters/mm$^2$;
with the addition of 15 wtppm, the crater count was 0.5 craters/mm$^2$;
with the addition of 20 wtppm, the crater count was 0.14 craters/mm$^2$;
with the addition of 40 wtppm, the crater count was 0.14 craters/mm$^2$;
with the addition of 80 wtppm, the crater count was 0.13 craters/mm$^2$;
with the addition of 100 wtppm, the crater count was 0.13 craters/mm$^2$; and
with the addition of 120 wtppm, the crater count was 0.12 craters/mm$^2$.

There is a reducing effect of the crater count with the addition of 120 wtppm, however, it was not preferable since foaming occurred and there is the problem of effluent treatment.

As described above, although the crater count was 1.8 craters/mm$^2$ with the addition of 3 wtppm, the number of craters decreased with the increase of the additive amount, and the crater count decreased to 1.3 craters/mm$^2$ with the addition of 5 wtppm, decreased to 1.0 craters/mm$^2$ with the addition of 10 wtppm, and further, as described above, the crater count decreased to 0.14 craters/mm$^2$ with the addition of 20 wtppm. Additional increase of the additive amount yielded roughly the same effect.

Accordingly, since it cannot be said that the addition of 3 wtppm yields a sufficient inhibiting effect of craters, the additive amount is desirably 5 wtppm or greater. When the additive amount exceeds 100 wtppm, it would be advisable to suppress the additive amount as much as possible since foaming will occur and there is the problem of effluent treatment. However, there is no particular limitation from the perspective of inhibiting the occurrence of craters.

Example 4

Next, the rolled copper foil subject to base plate as with Examples 1 to 3 above was subject to roughening treatment by way of copper plating treatment using plating baths additionally containing nickel sulfate (Example 4) or phosphorous acid (Example 5).

The foregoing conditions were used as the copper roughening plating bath and roughened copper plating conditions, that is, in the copper-nickel alloy plating treatment, 15 g/L of Cu ion concentration, 2 g/L of Ni ion concentration, 50 g/L of sulfuric acid, electrolytic solution temperature of 25° C., and current density of 50 A/dm$^2$. The plating thickness was roughly 50000 μg/dm$^2$.

As the additive, sodium dodecyl sulfate was used by 20 wtppm. Consequently, the crater count was the same as Example 1 at 0.14 craters/mm$^2$. As evident from the foregoing explanation, the roughening plating of Example 4 also yielded the same result of reducing craters as with Examples 1 to 3.

Example 5

Copper-Nickel-Phosphorous Alloy Plating Treatment

Copper-nickel-phosphorous alloy plating treatment was performed under the conditions of 15 g/L of Cu ion concentration, 2 g/L of Ni ion concentration, 1 g/L of P ion concentration, 50 g/L of sulfuric acid, electrolytic solution temperature of 25° C., and current density of 50 A/dm$^2$. The plating thickness was roughly 50000 μg/dm$^2$. As the additive, sodium dodecyl sulfate was used by 20 wtppm.

Consequently, the crater count was the same as Example 1 at 0.14 craters/mm$^2$. As evident from the foregoing explanation, the roughening plating of Example 5 also yielded the same result of reducing craters as with Examples 1 to 3.

Comparative Example 3 and Example 6

Next, an 18 μm rolled tough pitch copper foil having a surface roughness Rz of 0.7 μm was subject to degreasing and water washing treatment, subsequently subject to pickling and water washing treatment, and the roughened copper electroplating used in Example 3 was performed. Here, Comparative Example 3 was performed without any additive.

Meanwhile, the same rolled copper foil was subject to the same treatment using a copper electroplating bath added with the sodium dodecyl sulfate used in Example 3. The conditions were the same as Example 3.

Consequently, in Comparative Example 3, a crater count of 15 craters/mm$^2$ was observed. Contrarily, in Example 6, the number of craters decreased significantly to 0.15 craters/mm$^2$. This is evidently a result of adding sodium dodecyl sulfate.

Generally, the generation of craters is often observed in copper alloy foils. But the reason that craters occurred when using high purity tough pitch copper in Comparative Example 3 is considered to be the existence of copper oxides. In either case, it is evident that additives are effective.

Example 7 to Example 12

Other than changing the component composition of the copper alloy foil, the condition such as roughening treatment by way of copper plating treatment using a plating bath added with sodium octyl sulfate is the same as Example 1.

(Example 7) Rolled copper alloy foil containing 0.5 wt % of Ag and formed of remnant Cu and unavoidable impurities (Example 8) Rolled copper alloy foil containing 1 wt % of Sn and 0.3 wt % of Mg, and formed of remnant Cu and unavoidable impurities (Example 9) Rolled copper alloy foil containing 0.02 wt % or Cr and 0.01 wt % of Zr, and formed of remnant Cu and unavoidable impurities (Example 10) Rolled copper alloy foil containing 5 wt % of Zn, and formed of remnant Cu and unavoidable impurities (Example 11) Rolled copper alloy foil containing 2 wt % of Ni and 0.5 wt % of Si, and formed of remnant Cu and unavoidable impurities (Example 12) Rolled copper alloy foil containing 0.03 wt % of Ti and 0.3 wt % of Mg, and formed of remnant Cu and unavoidable impurities Examination of Crater Count of Example 7 to Example 12

The crater count of the respective Examples is shown below. In this case also, the crater inhibiting effect based on the roughening treatment by way of copper plating treatment was confirmed.

Example 7: 0.13 craters/mm$^2$
Example 8: 0.14 craters/mm$^2$
Example 9: 0.13 craters/mm$^2$
Example 10: 0.15 craters/mm$^2$
Example 11: 0.14 craters/mm$^2$
Example 12: 0.13 craters/mm$^2$ Example 7 to Example 12 were subject to additional testing in which the additive amount of sodium octyl sulfate was changed between 5 to 100 wtppm, but the results were the same as the foregoing section "(Examination of Crater Count when Additive Amount is Changed)".

The present invention yields a superior effect of obtaining a roughened rolled copper alloy foil with reduced craters, which are obvious defects unique to rolled copper or copper alloy foils with a roughened surface, whereby the roughened rolled copper alloy foil will have higher adhesive strength with the resin layer, possess acid resistance and anti-tin plating solution properties, have high peel strength, favorable etching properties and gloss level. Therefore, the present invention is quite effective in producing a flexible printed wiring board capable of realizing a fine wiring pattern of the rolled copper alloy foil subject to the roughening treatment of the present invention.

We claim:
1. A method of roughening a rolled copper or copper alloy foil to provide a roughened surface formed of fine copper particles on the foil, comprising a step of inhibiting formation of craters on the roughened surface caused by non-metal inclusions in the rolled copper or copper alloy foil by subjecting the rolled copper or copper alloy foil to roughening plating with a plating bath containing copper sulfate having a Cu equivalent of 1 to 50 g/L, 1 to 150 g/L of sulfuric acid, and one or more additives selected from the group consisting of sodium octyl sulfate, sodium decyl sulfate, and sodium dodecyl sulfate under the conditions of temperature of 20 to 50° C. and current density of 10 to 100 A/dm$^2$.

2. The method according to claim 1, wherein the one or more additives selected from the group consisting of sodium octyl sulfate, sodium decyl sulfate, and sodium dodecyl sulfate are added in a total amount of 5 to 100 wtppm.

3. The method according to claim 2, wherein the roughening plating is performed with a plating bath further containing nickel sulfate having a Ni equivalent of 1 to 50 g/L or phosphorous acid having a P equivalent of 0.75 to 1000 g/L.

4. The method according to claim 3, wherein a base plate layer formed of one or more components selected among Cu, Co, Ni or alloys having anyone of Cu, Co or Ni as its primary component is preliminarily formed on the rolled copper or copper alloy foil, and the roughened surface formed of fine copper particles is formed thereon.

5. The method according to claim 2, wherein the roughening plating is performed with the plating bath further containing nickel sulfate having a Ni equivalent of 1 to 50 g/L and phosphorous acid having a P equivalent of 0.75 to 1000 g/L.

6. The method according to claim 1, wherein the roughening plating is performed with a plating bath further containing nickel sulfate having a Ni equivalent of 1 to 50 g/L or phosphorous acid having a P equivalent of 0.75 to 1000 g/L.

7. The method according to claim 1, wherein a base plate layer faulted of one or more components selected among Cu, Co, Ni or alloys having anyone of Cu, Co or Ni as its primary component is preliminarily formed on the rolled copper or copper alloy foil, and the roughened surface formed of fine copper particles is formed thereon.

8. A method of roughening a rolled copper alloy foil, comprising a step of roughening plating the rolled copper alloy foil to produce a roughened surface formed of fine copper particles on the rolled copper alloy foil, the rolled copper alloy foil consisting of at least one element selected from the group consisting of Ag, Sn, Cr, Zr, Zn, Ni, Si, Mg, and Ti in a total amount of 0.03 to 5 wt % and remnant Cu and unavoidable impurities, and said roughening plating being performed by using a plating bath containing copper sulfate having a Cu equivalent of 1 to 50 g/L, 1 to 150 g/L of sulfuric acid, and one or more additives selected from the group consisting of sodium octyl sulfate, sodium decyl sulfate, and sodium dodecyl sulfate under the conditions of temperature of 20 to 50° C. and current density of 10 to 100 A/dm$^2$.

9. A method according to claim 8, wherein the one or more additives selected from the group consisting of sodium octyl sulfate, sodium decyl sulfate, and sodium dodecyl sulfate are added in a total amount of 5 to 100 wtppm.

10. A method according to claim 9, wherein the plating bath further contains nickel sulfate having a Ni equivalent of 1 to 50 g/L or phosphorous acid having a P equivalent of 0.75 to 1000 g/L.

11. A method according to claim 10, wherein a base plate layer formed of one or more components selected among Cu, Co, Ni or alloys having Cu, Co or Ni as its primary component is preliminarily formed on the rolled copper alloy foil, and the roughened surface formed of fine copper particles is formed thereon.

12. A method according to claim 11, wherein the at least one or more elements selected from the group consisting of Ag, Sn, Cr, Zr, Zn, Ni, Si, Mg, and Ti in a total amount of 0.03 to 5 wt % consists of 0.03 to 1 wt % of Zr, 0.05 to 1 wt % of Cr and/or 0 to 1 wt % of Zn.

13. A method according to claim 12, wherein said roughened surface produced by said roughening plating step has 1.3 craters/mm$^2$ or less.

14. A method according to claim 9, wherein the plating bath further contains nickel sulfate having a Ni equivalent of 1 to 50 g/L and phosphorous acid having a P equivalent of 0.75 to 1000 g/L.

15. A method according to claim 8, wherein the plating bath further contains nickel sulfate having a Ni equivalent of 1 to 50 g/L or phosphorous acid having a P equivalent of 0.75 to 1000 g/L.

16. A method according to claim 8, wherein a base plate layer formed of one or more components selected among Cu, Co, Ni or alloys having Cu, Co or Ni as its primary component is preliminarily formed on the rolled copper alloy foil, and the roughened surface formed of fine copper particles is formed thereon.

17. A method according to claim 8, wherein the at least one or more elements selected from the group consisting of Ag, Sn, Cr, Zr, Zn, Ni, Si, Mg, and Ti in a total amount of 0.03 to 5 wt % consists of 0.03 to 1 wt % of Zr, 0.05 to 1 wt % of Cr and/or 0 to 1 wt % of Zn.

18. A method according to claim 8, wherein said roughened surface produced by said roughening plating step has 1.3 craters/mm$^2$ or less.

19. A method according to claim 8, wherein the plating bath further contains nickel sulfate having a Ni equivalent of 1 to 50 g/L and phosphorous acid having a P equivalent of 0.75 to 1000 g/L.

20. A method of roughening a rolled copper foil to provide a roughened surface formed of fine copper particles on the foil, comprising a step of inhibiting formation of craters on the roughened surface caused by non-metal inclusions in the rolled copper foil by subjecting the rolled copper foil to roughening plating with a plating bath containing copper sulfate having a Cu equivalent of 1 to 50 g/L, 1 to 150 g/L of sulfuric acid, and one or more additives selected from the group consisting of sodium octyl sulfate, sodium decyl sulfate, and sodium dodecyl sulfate under the conditions of temperature of 20 to 50° C. and current density of 10 to 100 A/dm$^2$.

21. The method according to claim 20, wherein the one or more additives selected from the group consisting of sodium octyl sulfate, sodium decyl sulfate, and sodium dodecyl sulfate are added in a total amount of 5 to 100 wtppm.

22. The method according to claim 20, wherein the roughening plating is performed with a plating bath further containing nickel sulfate having a Ni equivalent of 1 to 50 g/L or phosphorous acid having a P equivalent of 0.75 to 1000 g/L.

23. The method according to claim 20, wherein a base plate layer formed of one or more components selected among Cu, Co, Ni or alloys having anyone of Cu, Co or Ni as its primary component is preliminarily formed on the rolled copper foil, and the roughened surface formed of fine copper particles is formed thereon.

24. The method according to claim 20, wherein the roughening plating is performed with the plating bath further containing nickel sulfate having a Ni equivalent of 1 to 50 g/L and phosphorous acid having a P equivalent of 0.75 to 1000 g/L.

* * * * *

UNITED STATES PATENT AND TRADEMARK OFFICE
CERTIFICATE OF CORRECTION

PATENT NO.        : 8,252,166 B2
APPLICATION NO.   : 13/243187
DATED             : August 28, 2012
INVENTOR(S)       : Yousuke Kobayashi It is certified that error appears in the above-identified patent and that said Letters Patent is hereby corrected as shown below:

Column 13, line 28 "layer faulted" should read "layer formed"

Signed and Sealed this
Thirteenth Day of November, 2012

David J. Kappos
*Director of the United States Patent and Trademark Office*